(12) United States Patent
Miyazaki et al.

(10) Patent No.: US 10,477,677 B2
(45) Date of Patent: Nov. 12, 2019

(54) OPTICAL MODULATOR WITH FPC AND OPTICAL TRANSMISSION DEVICE USING SAME

(71) Applicant: SUMITOMO OSAKA CEMENT CO., LTD., Tokyo (JP)

(72) Inventors: Norikazu Miyazaki, Tokyo (JP); Ryo Shimizu, Tokyo (JP); Toru Sugamata, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 0 days.

(21) Appl. No.: 16/086,320

(22) PCT Filed: Sep. 15, 2016

(86) PCT No.: PCT/JP2016/077240
§ 371 (c)(1),
(2) Date: Sep. 19, 2018

(87) PCT Pub. No.: WO2017/168790
PCT Pub. Date: Oct. 5, 2017

(65) Prior Publication Data
US 2019/0098744 A1 Mar. 28, 2019

(30) Foreign Application Priority Data

Mar. 30, 2016 (JP) .................................. 2016-068523

(51) Int. Cl.
*H05K 1/02* (2006.01)
*G02F 1/03* (2006.01)
(Continued)

(52) U.S. Cl.
CPC ............... *H05K 1/028* (2013.01); *G02F 1/03* (2013.01); *G02F 1/035* (2013.01); *G02F 1/2255* (2013.01);
(Continued)

(58) Field of Classification Search
CPC .......................................................... G02F 1/03
See application file for complete search history.

(56) References Cited

U.S. PATENT DOCUMENTS 9,810,965 B2 * 11/2017 Ishii ..................... G02F 1/225
10,091,881 B1 * 10/2018 Kataoka ................. H01R 12/65
(Continued)

FOREIGN PATENT DOCUMENTS

JP 2002134860 5/2002
JP 2006228988 8/2006
(Continued)

OTHER PUBLICATIONS

"International Search Report (Form PCT/ISA/210)" of PCT/JP2016/077240, dated Dec. 20, 2016, with English translation thereof, pp. 1-4.

*Primary Examiner* — Sung H Pak
(74) *Attorney, Agent, or Firm* — JCIPRNET

(57) ABSTRACT

An optical modulator with FPC and optical transmission device using the same are provided. This optical modulator includes a flexible printed circuit which electrically connects the optical modulator to a circuit board. The flexible printed circuit has a substantially quadrilateral shape. A pad is formed on the flexible printed circuit along one side of the substantially quadrilateral shape so as to be electrically connected to the circuit board. In order to release the mechanical stress applied onto the side or the end portion of the flexible printed circuit and/or to prevent propagation of distortion generated in the side or the end portion, the flexible printed circuit has: a cutout or a notch provided in a direction from a part of at least one side toward the inside of the flexible printed circuit; and/or a curved portion connecting at least two adjacent sides.

12 Claims, 13 Drawing Sheets

(51) Int. Cl.
*G02F 1/035* (2006.01)
*G02F 1/225* (2006.01)
*H01R 12/62* (2011.01)
*H01R 12/67* (2011.01)
*H05K 1/11* (2006.01)
*G02F 1/21* (2006.01)

(52) U.S. Cl.
CPC ............. *H01R 12/62* (2013.01); *H01R 12/67* (2013.01); *H05K 1/115* (2013.01); *H05K 1/117* (2013.01); *H05K 1/118* (2013.01); *G02F 2001/212* (2013.01); *H05K 2201/09027* (2013.01); *H05K 2201/09136* (2013.01); *H05K 2201/09163* (2013.01); *H05K 2201/09609* (2013.01)

(56) References Cited

U.S. PATENT DOCUMENTS

| | | | | |
|---|---|---|---|---|
| 2004/0208211 | A1* | 10/2004 | Maruyama | H01S 5/02212 372/38.1 |
| 2006/0198569 | A1* | 9/2006 | Ohtsu | G02B 6/02042 385/14 |
| 2008/0170819 | A1* | 7/2008 | Kodama | G02B 6/138 385/14 |
| 2009/0029570 | A1* | 1/2009 | Ikeuchi | H01P 1/047 439/67 |
| 2010/0119192 | A1* | 5/2010 | Fujikata | B82Y 20/00 385/14 |
| 2010/0155109 | A1 | 6/2010 | Takahashi | |
| 2011/0032687 | A1* | 2/2011 | Song | H05K 3/361 361/803 |
| 2011/0081118 | A1 | 4/2011 | Uemura et al. | |
| 2012/0047727 | A1 | 3/2012 | Takahashi | |
| 2013/0027762 | A1 | 1/2013 | Sygiyama | |
| 2015/0362823 | A1 | 12/2015 | Sugiyama | |
| 2016/0216539 | A1 | 7/2016 | Sugiyama | |

FOREIGN PATENT DOCUMENTS

| | | |
|---|---|---|
| JP | 2008135465 | 6/2008 |
| JP | 2009016578 | 1/2009 |
| JP | 2011082209 | 4/2011 |
| JP | 2012119410 | 6/2012 |
| JP | 2013029791 | 2/2013 |
| JP | 2016001284 | 1/2016 |
| JP | 2016139723 | 8/2016 |
| WO | 2010073780 | 7/2010 |

\* cited by examiner

| b/a | 0.25 | 0.5 | 0.75 | 1.0 | 1.25 | 1.5 | 1.75 | 2.0 | 2.5 | 3.0 | 4.0 |
|---|---|---|---|---|---|---|---|---|---|---|---|
| EVALUATION RESULT | ○ | ○ | ◎ | ◎ | ○ | △ | ○ | △ | △ | × | × |

| c/a | 0.25 | 0.5 | 1.0 | 1.50 | 2.0 | 4.0 |
|---|---|---|---|---|---|---|
| EVALUATION RESULT | × | △ | ○ | ○ | ◎ | ◎ |

| c/a | 0.25 | 0.5 | 1.0 | 1.50 | 2.0 | 4.0 |
|---|---|---|---|---|---|---|
| EVALUATION RESULT | × | × | ○ | ○ | ◎ | ○ |

| R/L | 1/25 | 1/15 | 1/10 | 1/7 | 1/5 | 1/3 | 1/2 | 1 |
|---|---|---|---|---|---|---|---|---|
| EVALUATION RESULT | △ | × | × | ○ | ◎ | ○ | ◎ | ◎ |

OPTICAL MODULATOR WITH FPC AND OPTICAL TRANSMISSION DEVICE USING SAME

CROSS-REFERENCE TO RELATED APPLICATION

This application is a 371 of international application of PCT application serial no. PCT/JP2016/077240, filed on Sep. 15, 2016, which claims the priority benefit of Japan application no. 2016-068523, filed on Mar. 30, 2016. The entirety of each of the above-mentioned patent applications is hereby incorporated by reference herein and made a part of this specification.

TECHNICAL FIELD

The present invention relates to an optical modulator and an optical transmission apparatus, and particularly, to an optical modulator including a flexible printed circuits (FPC) for inputting high-frequency signals, and an optical transmission apparatus using the optical modulator.

BACKGROUND ART

In high-frequency/large-capacity optical fiber communication systems, optical modulators incorporating waveguide type optical modulation elements are widely used. Among them, an optical modulation element using $LiNbO_3$ (hereinafter, also referred to as an LN) having an electro-optic effect on a substrate has been widely used for high-frequency/large-capacity optical fiber communication systems because optical modulation characteristics with a small light loss and a wideband can be realized.

In the optical modulation element using the LN, a Mach-Zehnder type optical waveguide, an RF electrode for applying a high-frequency signal as a modulation signal to the waveguide, and a bias electrode for performing various adjustments in order to maintain satisfactory modulation characteristics in the waveguide are formed. These electrodes formed in the optical modulation element are connected to an external electronic circuit via lead pins or connectors that are provided in a housing of the optical modulator including the optical modulation element.

On the other hand, modulation forms in optical fiber communication systems have influenced by a trend to increase transmission capacity in recent years, and transmission formats obtained by applying multi-level modulation or polarization multiplexing incorporated into the multi-level modulation such as a Quadrature Phase Shift Keying (QPSK) and a Dual Polarization-Quadrature Phase Shift Keying (DP-QPSK), and the like have been mainstreamed.

Since an optical modulator (QPSK modulator) that performs QPSK modulation or an optical modulator (DP-QPSK modulator) that performs DP-QPSK modulation includes a nested Mach-Zehnder type optical waveguide, and has a plurality of high-frequency signal electrodes and a plurality of bias electrodes (see, for example, Patent Literature No. 1), the size of device tends to increase, and there is a strong demand for miniaturization in particular.

As a countermeasure against this demand for miniaturization, in the related art, push-on type coaxial connectors that are provided in the housing of the optical modulator as an interface for connecting an RF electrode and an external electronic circuit, have been replaced with the same lead pins as those of an interface of a bias electrode, and the optical modulator with a flexible printed circuits (FPC) added for connecting these lead pins to an external circuit board has been realized.

For example, in a DP-QPSK modulator, there is used an optical modulation element including four Mach-Zehnder type optical waveguides each having an RF electrode. In this case, since four push-on type coaxial connectors are provided in the housing of the optical modulator, it is inevitable to increase the size of the housing. However, it is possible to realize miniaturization by using lead pins and an FPC instead of coaxial connectors.

Since the lead pins in the housing of the optical modulator and the circuit board on which an electronic circuit for causing the optical modulator to perform a modulation operation is mounted are connected via the FPC, there is no need to use a coaxial cable used in the related art and a space required for the surplus length processing of the coaxial cable and it is possible to reduce a mounting space of the optical modulator in the optical transmission apparatus.

The FPC used for the optical modulator is manufactured by using, for example, a flexible polyimide-based material for a substrate (hereinafter, referred to as an FPC substrate), and a plurality of through-holes formed near one end portion are electrically connected to the same number of pads formed on an other end portion. A plurality of lead pins, which protrude from a bottom surface or side surface of the housing of the optical modulator, are inserted through the plurality of through-holes, respectively, and the lead pins and through-holes are fixed with solders. The plurality of pads are fixed to the circuit board with solders, respectively. As a result, each of high-frequency signals given from pads on the circuit board is, via the corresponding via through-holes and lead pins, given to the corresponding RF electrode of the optical modulation element, and high-frequency optical modulation is performed.

In the optical modulator using the FPC, as described above, the housing may be miniaturized and the mounting space of the optical modulator on the circuit board may be reduced, so that it contributes greatly to miniaturization of the optical transmission apparatus.

FIGS. 16A, 16B, and 16C are views showing a configuration of an optical modulator in the related art, including such an FPC; FIG. 16A is a top view of the optical modulator; FIG. 16B is a front view of the optical modulator; and FIG. 16O is a bottom view of the optical modulator. This optical modulator 1600 includes an optical modulation element 1602, a housing 1604 that houses the optical modulation element 1602, a flexible wiring board (FPC) 1606, an optical fiber 1608 for inputting light to the optical modulation element 1602, and an optical fiber 1610 that guides the light output from the optical modulation element 1602 to the outside of the housing 1604.

Four lead pins 1620, 1622, 1624, and 1626 connected to the four RF electrodes (not shown) of the optical modulation element 1602, respectively, are provided in the housing 1604, the lead pins 1620, 1622, 1624, and 1626 are inserted through through-holes 1720, 1722, 1724, and 1726, as described later, provided in the FPC 1606, and the lead pins and through-holes are fixed with solders.

FIG. 17 is a diagram showing a configuration of the FPC 1606. In the FPC 1606, four pads 1710, 1712, 1714, and 1716 are formed side by side in the vicinity of one side 1700 on a lower side in the figure along a direction of the one side 1700. On the side of an other side 1702 opposite to the side 1700, for example, four through-holes 1720, 1722, 1724, and 1726 are formed side by side along a direction of the side 1702. Further, the four pads 1710, 1712, 1714, and 1716 are electrically connected to the through-holes 1720, 1722, 1724, and 1726 by wiring patterns 1730, 1732, 1734, and 1736, respectively.

The four pads 1710, 1712, 1714, and 1716, respectively, are soldered to the pads of the external circuit board, thereby electrically connecting the RF electrodes of the optical modulation element 1602 included in the optical modulator 1600 to an electronic circuit configured on the circuit board, and mounting the optical modulator. Generally, a shape of the FPC 1606 is a horizontally elongated rectangle having a short side in a signal transmission direction as shown in the figure so as to shorten the wiring pattern as short as possible to suppress microwave loss, and in the case where the FPC 1606 has four pads 1710, 1712, 1714, and 1716 as in the shown example, the shape of the FPC 1606 is a rectangle having a length of about 20 mm or less in a long side direction and a length of about 10 mm or less in a short side direction.

FIGS. 18A and 18B are diagrams showing an example of a state in which an optical modulator 1600 is connected to a circuit board on which an electronic circuit is formed; FIG. 18A is a top view of the optical modulator 1600; and FIG. 18B is a sectional view taken along an arrow B-B in FIG. 18A. In FIG. 18B, the description of the internal configuration of the optical modulator 1600 will be not repeated.

The optical modulator 1600 and the circuit board 1800 are fixed to, for example, a base 1802 in the housing of the optical transmission apparatus. The FPC 1606 of the optical modulator 1600 extends leftward in the figure from a connection portion with the lead pins 1620, 1622, 1624, and 1626 and is directed obliquely and bent downward to the left in the figure of FIG. 18B, and the pads 1710, 1712, 1714, and 1716 in the FPC 1606 are soldered to the pads 1810, 1812, 1814, and 1816 on the circuit board 1800.

However, when the optical transmission apparatus is configured such that the optical modulator with the FPC as described above is connected to the circuit board, slight variation (variation in the thickness of intervening solders, variation in uniformity of the thickness, and variation in positional deviations between the FPC pads and the circuit board pads) may be generated in a connection state between the pads (FPC pads) 1710, 1712, 1714, and 1716 on the FPC 1606 and the pads (circuit board pads) 1810, 1812, 1814, and 1816 on the circuit board 1800, due to a deformation of the FPC 1606 generated in manufacturing of the FPC 1606, and various deformations such as warping and elongation of the FPC 1606, and the like generated when the FPC 1606 is soldered to the lead pins 1620, 1622, 1624, and 1626 in the housing 1604 of the optical modulator.

FIG. 19 is a diagram showing an example of a deformed FPC. In the shown example, the FPC 1900 is deformed upward in the figure at the corner portions of the substrate. Such deformation is commonly seen as a deformation caused by a manufacturing process of the FPC. For example, the FPC includes a wiring pattern formed of copper (Cu), gold (Au), or the like on a polyimide substrate, and further includes a protective film for protecting these wiring patterns and the like. Individual FPCs are manufactured by, for example, repeating and forming a wiring pattern configuring one FPC on a sheet-like base material of an FPC board in a matrix form at a plurality of times, and punching a portion configuring one FPC from the sheet-like base material. It is considered that the deformation at the corner portions as shown in the figure is derived from mass-production of individual FPCs due to punching as described above.

However, the deformation of the FPC generated at the time of manufacturing is generated due to various factors in the process of manufacturing the FPC, and the degree of the deformation may be changed due to factors such as material lot and production lot, and the like the deformation also has various shapes such as warping, undulation, elongation, and the like, and it is difficult to control and suppress them.

Further, such deformation of the FPC is generated not only by a manufacturing process, but also by heat generated when the FPC is soldered to the lead pin provided in the housing of the optical modulator, stress caused by stress applied to the FPC when the optical modulator is incorporated in the optical transmission apparatus, or stress applied to the FPC when the optical modulator is mounted on the circuit board.

Particularly, in the optical modulator, since the high-frequency signal propagated to the FPC reaches the microwave region of several tens of GHz, due to slight variation in the connection state as described above, large variation in reflection characteristics and transmission characteristics of a high-frequency signal path from the circuit board pad to the lead pin may be generated. As a result, it may be difficult to secure desirable optical transmission quality while maintaining satisfactory optical modulation characteristics in the optical modulator.

This problem may occur with comparative ease, caused by followings. Since the FPC pads have as small a size as possible due to the demand for miniaturization of the optical modulator, deformation of the FPC is likely to be generated by stress and the like applied to the FPC board during a manufacturing process of the FPC (for example, a punching process of the board), and since the FPC pads are very small, the FPC pads are likely to have positional deviations when they are soldered to the circuit board, and the like.

As a technique for solving such a problem, in the related art, particularly, in order to solve the above problem caused by that the FPC board is deformed into a U shape by its own weight, there is known an optical module in which, in order to deform the FPC into an inverse-U shape, a raised portion is provided on a portion of the housing on which the FPC abuts (Patent Literature No. 1).

However, even when the FPC is deformed into an inverse-U shape, it is difficult to manage various deformations such as warping and elongation, and the like of the FPC, which may be generated in an assembly process of soldering between the lead pins in the housing of the optical modulator and the FPC, or manage the deformation in manufacturing of the FPC itself in a constant state. Due to variation in processing of the raised portion provided on a portion of the housing, variation in deformation of the FPC may be also generated when the FPC is caused to abut on the raised portion. Therefore, the technique of the related art is limited to maintaining satisfactory optical modulation characteristics of the optical modulator by reducing various variation in manufacturing as described above. Further, in the technique of the related art, since a processing step of providing a raised portion on a portion of the housing is required, a manufacturing cost also increases.

CITATION LIST

Patent Literature

[Patent Literature No. 1] Japanese Laid-open Patent Publication No. 2016-1284

SUMMARY OF INVENTION

Technical Problem

From the background, in an optical modulator including an FPC that makes an electrical connection with an external circuit board, it is preferable to effectively and inexpensively reduce variation in high-frequency characteristics of a signal path from the circuit board to the optical modulator.

Solution to Problem

According to one embodiment of the present invention, there is provided an optical modulator including a flexible wiring board that makes an electrical connection with a circuit board, wherein the flexible wiring board has a substantially quadrilateral shape, pads to be electrically connected to the circuit board are formed on the flexible wiring board along one side of the substantially quadrilateral shape, and in order to release mechanical stress applied to a side or an end portion of the flexible wiring board and/or prevent propagation of strain generated in the side or the end portion, the flexible wiring board has cutout or notch provided from a portion of at least one side toward the inside of the flexible wiring board, and/or is provided with a curved portion connecting at least two adjacent sides.

According to another aspect of the present invention, the cutout or notch is formed from a portion of each of the two sides adjacent to the one side on which the pads are formed, out of the sides configuring the substantially quadrilateral shape.

According to still another aspect of the present invention, the pads are formed from the one side to a position of a distance a, and the cutout or notch is formed at positions within a distance 1.25×a from the one side.

According to still another aspect of the present invention, the cutout or the notch is provided in a direction substantially parallel to the one side.

According to still another aspect of the present invention, the cutout or notch is formed at two positions between which a portion on which the pads are formed is interposed, on the one side in a direction substantially perpendicular to the one side.

According to still another aspect of the present invention, the notch is formed in a shape obtained by cutting the flexible wiring board along a predetermined curve.

According to still another aspect of the present invention, the pads are formed from the one side to a position of a distance a, and the notch is provided such that a length c of an opening of the notches in the side where the notches are provided, and a distance d from the one side to a near end of the opening have a relationship of a≤d and a≤c relative to the distance a.

According to still another aspect of the present invention, the notch is disposed on a side opposite to the one side on which the pads are formed, out of the sides configuring the substantially quadrilateral shape, and the notch is formed in a shape obtained by cutting the flexible wiring board along a predetermined curve.

According to still another aspect of the present invention, the curved portions are respectively provided in connection portions between a side opposite to the one side on which the pads are formed, and two sides adjacent to the opposite side, out of the sides configuring the substantially quadrilateral shape.

According to still another aspect of the present invention, the curved portions have a radius of curvature R that satisfies a relationship of R≥L/7 relative to a distance L between the one side on which the pads are formed, and the opposite side.

According to still another aspect of the present invention, the notch is provided from a portion of each of two sides adjacent to the one side on which the pads are formed, out of the sides configuring the substantially quadrilateral shape, and the notch is formed in a shape obtained by cutting the flexible wiring board along a predetermined curve.

According to still another aspect of the present invention, at least one notch is provided on a side opposite to the one side on which the pads are formed, out of the sides configuring the substantially quadrilateral shape, and the notch is formed in a shape obtained by cutting the flexible wiring board along a predetermined curve.

According to still aspect of the present invention, there is provided an optical transmission apparatus including: one of optical modulators as described above, and an electronic circuit for generating an electrical signal to cause the optical modulator to perform a modulation operation.

DESCRIPTION OF EMBODIMENTS

Hereinafter, embodiments of the present invention will be described with reference to the drawings.

First Embodiment

Figure 1A:
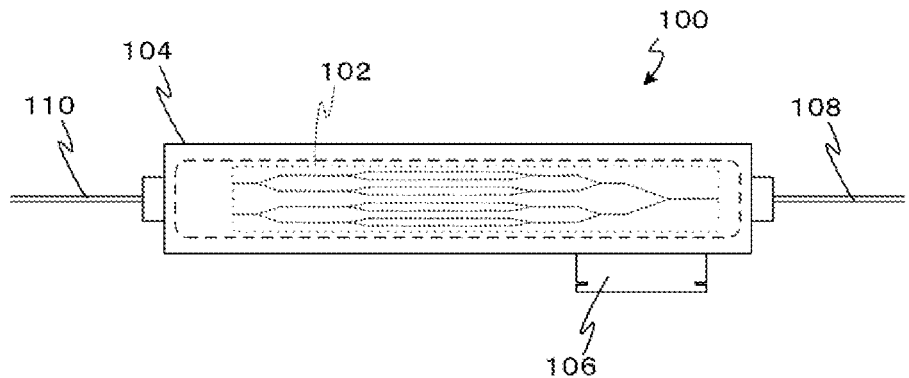
FIG. 1A is a top view of an optical modulator according to a first embodiment of the present invention.
Figure 1B:
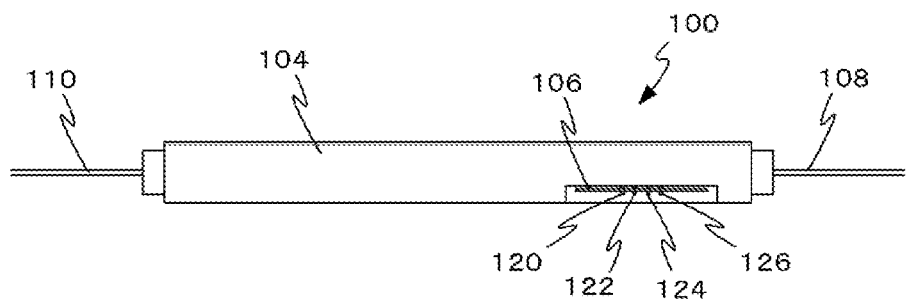
FIG. 1B is a side view of the optical modulator according to the first embodiment of the present invention.
Figure 1C:
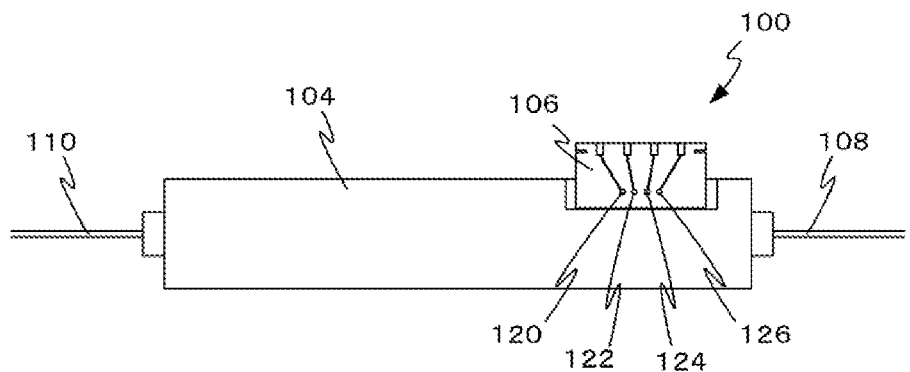
FIG. 1C is a bottom view of the optical modulator according to the first embodiment of the present invention.

FIGS. 1A, 1B, and 1C are diagrams showing a configuration of an optical modulator according to a first embodiment of the present invention. This optical modulator 100 includes an optical modulation element 102, a housing 104 that houses the optical modulation element 102, a flexible wiring board (FPC) 106 that makes an electrical connection with an external circuit board, an optical fiber 108 for inputting light to the optical modulation element 102, and an optical fiber 110 that guides light output from the optical modulation element 102 to the outside of the housing 104.

The optical modulation element 102 is a DP-QPSK modulator including, for example, four Mach-Zehnder type optical waveguides formed on an LN substrate, and four high-frequency electrodes (RF electrodes) which are formed on each of the Mach-Zehnder type optical waveguides and modulate light waves propagating in the optical waveguides. Two rays output from the optical modulation element 102 are polarization-combined by a lens optical system including, for example, a polarization beam combiner, and guided to the outside of the housing 104 via the optical fiber 110.

The housing 104 includes four lead pins 120, 122, 124, and 126 connected to four RF electrodes (not shown) of the optical modulation element 102, respectively. The lead pins 120, 122, 124, and 126 provided in the housing 104 are inserted through through-holes 220, 222, 224, and 226, as described later, provided in the FPC 106, and the through-holes 220, 222, 224, and 226 are fixed to the lead pins 120, 122, 124, and 126 with solders, respectively.

Figure 2:
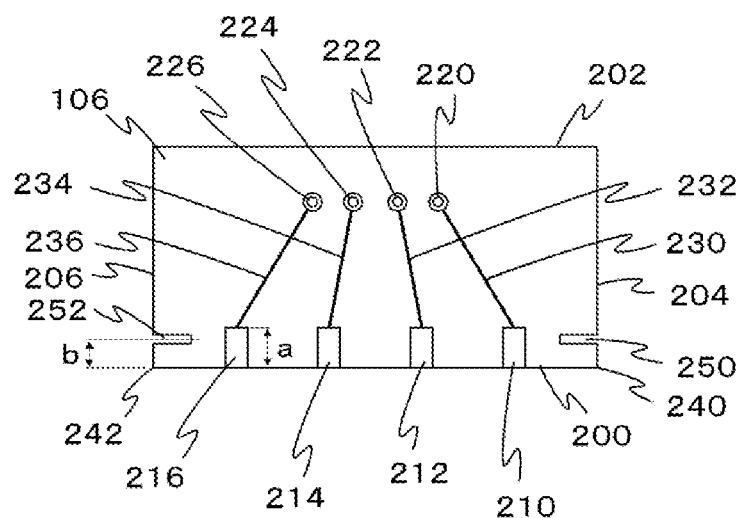
FIG. 2 is a diagram showing a configuration of an FPC used for the optical modulator shown in FIG. 1A.

FIG. 2 is a diagram showing a configuration of the FPC 106. The FPC 106 is manufactured by using, for example, a polyimide-based material for a substrate (hereinafter, referred to as an FPC substrate). For example, the FPC 106 is a rectangle in a plan view. As described above, in general, the shape of the FPC 1606 is a horizontally elongated rectangle so as to shorten wiring patterns as much as possible to suppress microwave loss. Therefore, in the present embodiment, the FPC 106 also has a rectangular shape. However, the shape of the FPC 106 is not limited to this shape, and may be, for example, a shape of a substantially quadrilateral shape. In the following description, the term "side" refers to a side of a rectangle formed by the FPC 106. In the case where the FPC 106 is formed in a substantially quadrilateral shape, the "side" is a side of the substantially quadrilateral shape which the FPC 106 has.

Four pads 210, 212, 214, and 216 are formed side by side in the vicinity of one side 200 on a lower side in the figure of the FPC 106 along a direction of the one side 200. On the side of another side 202 opposite to the side 200, for example, four through-holes 220, 222, 224, and 226 are formed side by side along the direction of the side 202. Further, the four pads 210, 212, 214, and 216 are electrically connected to the through-holes 220, 222, 224, and 226 by wiring patterns 230, 232, 234, and 236, respectively.

As described above, since the four through-holes 220, 222, 224, and 226, respectively, are connected to the four lead pins 120, 122, 124, and 126 provided in the housing 104, the pads 210, 212, 214, and 216, respectively, are connected to the pads configuring a portion of an electronic circuit provided on an external circuit board (for example, by soldering), thereby applying high-frequency signals output from the electronic circuit to the RF electrodes of the optical modulation element 102 via the FPC 106.

The wiring patterns 230, 232, 234, and 236 formed in FPC 106 may be configured using a known line configuration as a signal line for high frequency, such a microstrip line, coplanar line, grounded coplanar line, or the like and a ground pattern may be also formed on the FPC 106 according to this configuration (not shown).

As in the FPC 1606 of the related art as described above, the size of the FPC 106 has, for example, a length of about 20 mm or less in a long side direction (a direction of the side 200), and a length of about 10 mm or less in a short side direction (a direction perpendicular to the side 200), so as to shorten the lengths of the wiring patterns 230, 232, 234, and 236 as short as possible to suppress microwave loss.

Figure 3A:
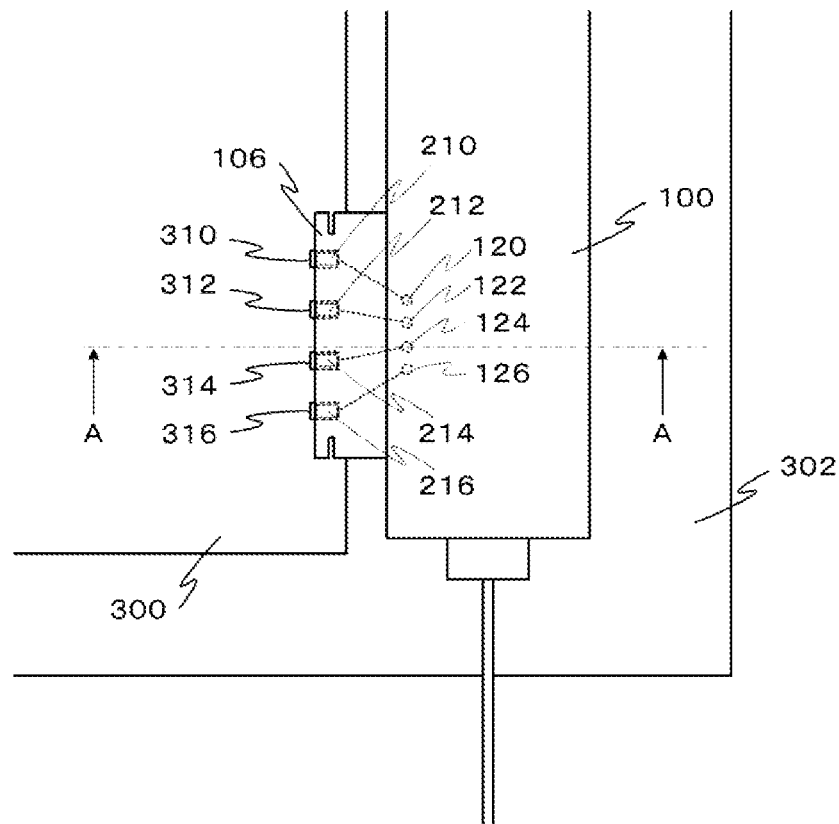
FIG. 3A is a diagram showing an example of a state in which the optical modulator shown in FIG. 1A is connected to a circuit board on which an electronic circuit is formed.
Figure 3B:
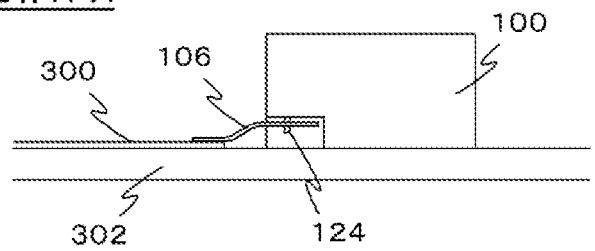
FIG. 3B is a diagram showing an example of a state in which the optical modulator shown in FIG. 1A is connected to the circuit board on which the electronic circuit is formed.

FIGS. 3A and 3B are diagrams showing an example of a state in which the optical modulator 100 is connected to a circuit board on which an electronic circuit is formed; FIG. 3A is a top view of the optical modulator 100; and FIG. 3B is a sectional view taken along an arrow A-A in FIG. 3A. In FIG. 3B, the description of the internal configuration of the optical modulator 100 will be not repeated.

The optical modulator 100 and the circuit board 300 are fixed to, for example, a base 302 in the housing of the optical transmission apparatus. The FPC 106 of the optical modulator 100 extends leftward in the figure from a connection portion with the lead pins 120, 122, 124, and 126 and is directed obliquely and bent downward to the left in the figure of FIG. 3B, and the pads 310, 312, 314, and 316 on the circuit board 300 are soldered to the pads 210, 212, 214, and 216.

Particularly, in the optical modulator 100 of this embodiment, as shown in FIG. 2, on two sides 204 and 206 adjacent to one side 200 on which the pads 210, 212, 214, and 216 are formed, out of the four sides of a rectangular FPC 106, there are symmetrically provided rectangular notches 250 and 252 formed in a direction from a portion of each of the sides 204 and 206 toward the inside of the FPC 106, at positions in the vicinity of two corner portions 240 and 242 which are connected to the one side 200. As a result, for example, when in order to solder the pads 210, 212, 214, and 216 to the pads 310, 312, 314, and 316 of the circuit board 300, the vicinity of the side 200 of the FPC 106 is pressed against the circuit board 300, mechanical stress (hereinafter, simply referred to as "stress") applied to various deformed portions such as warping and elongation existing, and the like in the corner portions 240 and 242 is released by the notches 250 and 252, so that a reaction force at the time of pressing (a force against the force of the pressing caused by that the deformed portions are deformed along the surface of the circuit board 300 due to the pressing) is weakened.

Accordingly, an amount of deformation of the pads 210, 212, 214, and 216 of the FPC 106 with respect to the pads 310, 312, 314, and 316 on the circuit board 300 is reduced, a force required for positioning is weakened and the positioning is performed with ease, so that the positions of the pads 210, 212, 214, and 216 may be accurately fixed to the pads 310, 312, 314, and 316. Since a force required for bringing the pads 210, 212, 214, and 216 into close contact with the pads 310, 312, 314, and 316 is also weakened, it is possible to reduce the uniformity of the thickness of the solders interposed between the pads 210, 212, 214, and 216 and the pads 310, 312, 314, and 316, and to reduce variation in the thickness of the solders for each product. As a result, it is possible to effectively reduce, for example, variation in high-frequency characteristics of signal paths from the pads 310, 312, 314, and 316 of the circuit board 300 to the lead pins 120, 122, 124, and 126 of the optical modulator 100.

When a mold used to punch the FPC 106 from, for example, a sheet base material of the FPC is designed with the shape shown in FIG. 2, it is possible to manufacture the notches 250 and 252 of the FPC 106 without requiring an additional step. Therefore, the aforementioned effects may be realized at a low cost.

That is, in the optical modulator 100 including the aforementioned configurations, since on each of two sides 204 and 206 adjacent to one side 200 on which the pads 210, 212, 214, and 216 to be connected to the circuit board are formed, of the FPC 106 that connects the four lead pins 120, 122, 124, and 126 provided in the housing 104 to the external circuit board, there are provided rectangular notches 250 and 252, it is possible to effectively relieve stress applied to the FPC 106 and a reaction force of pressing caused by stress when the FPC 106 is pressed against and fixed to the circuit board with solders, even if deformation in the FPC 106 is generated. As a result, variation in uniformity of the thickness of solders and positioning variation in a process of fixing with the solders are reduced, and variation in high-frequency characteristics of the optical modulator 100 after connected to the circuit board are effectively reduced.

Since a depth of the notches 250 and 252 (a depth from the corresponding sides 204 and 206) is higher, an effect of relieving the reaction force is higher, but the end portions of the notches 250 and 252 are portions at which the stress concentrates, it is necessary to determine the end portions not to be positioned too close to the pads 210, 212, 214, and 216. For example, when the length of the FPC 106 in the direction of the side 200 is about 20 mm or less, the depth of the notches 250 and 252 falls within a range of several mm, but it is possible to obtain sufficient effects even in this range.

Figures 4, 5:
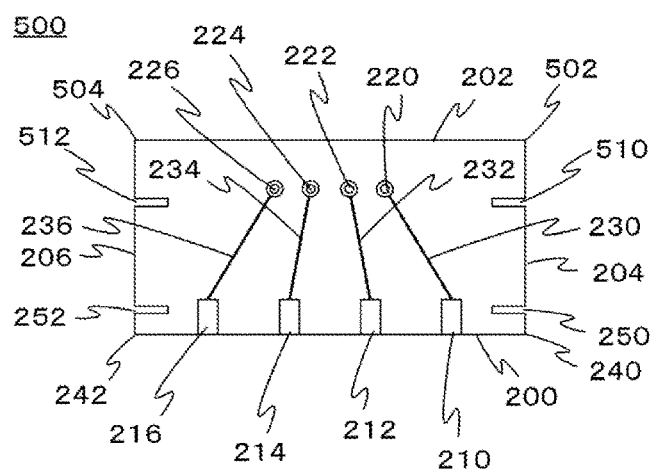
FIG. 4 is a diagram showing an evaluation result on a relationship between a position of the notch and solder connection quality in the FPC shown in FIG. 2.
FIG. 5 is a diagram showing a first modified example of the FPC used for the optical modulator shown in FIG. 1A.

The effect of relieving the reaction force may also depend on positions at which the notches 250 and 252 are provided. FIG. 4 shows results obtained by evaluating the uniformity and finished quality of solder connection portions between the pads 210, 212, 214, and 216 of the FPC 106 and the pads 310, 312, 314, and 316 of the circuit board 300, by changing the position of the notches 250 and 252. A parameter b/a obtained by normalizing the distance b from the side 200 shown in FIG. 2 to the center of the opening (opening portion) of the notches 250 and 252 with a length a (vertical length in the figure) of the pads 210, 212, 214, and 216, was used to represent the positions of the notches 250 and 252, and the uniformity and finished quality of the solder connection portions were evaluated in various values of b/a. The length a of the pads 210, 212, 214, and 216 used for the evaluation is about 1.3 mm.

In the evaluation, one of four stages of A (very satisfactory), B (satisfactory), C (not enough), and D (bad) is determined. This determination is performed based on "quality criteria in the micro soldering technology certification and verification test" (JWES-MS060801J) determined by the Japan Welding Engineering Society, taking finished uniformity into account. This quality determination standard is based on the quality standard of the high reliability equipment described in JIS C 61191 "PRINTED BOARD ASSEMBLIES", and specifies concrete quality determination standards more than demand criteria of the JIS.

As a result obtained by comparing the evaluation of connection uniformity/finished quality with the evaluation of the worst value variation in the high-frequency reflection characteristics S11 of the four RF signal paths from the four pads 210, 212, 214, and 216 to the four RF electrodes (not shown) of the optical modulation element 102, roughly, the worst value variation is about 3 dB in "D" evaluation, about 2 dB in "C" evaluation, about 1 dB in "B" evaluation, or about 0.5 dB in "A" evaluation. That is, there is a certain correlation between the result of the evaluation and the degree of the variation in the high-frequency characteristics, and it is possible to improve variation in high-frequency characteristics of the optical modulator 100 by using the configuration of the FPC that obtains satisfactorily higher or better results in the evaluation.

According to the evaluation result shown in FIG. 4, the connection uniformity/finished quality tends to decrease as the positions of the notches 250 and 252 are away from the pads 210, 212, 214, and 216, and it is understood that practically satisfactory quality may be obtained in a range of b/a≤1.25. This tendency was the same for the evaluation performed relative to the pads 210, 212, 214, and 216 having a length a different from the length (about 1.3 mm) as described above.

Therefore, it is preferable that there are provided the notches 250 and 252 at positions such that a distance b from the side 200, where the pads 210, 212, 214, and 216 are provided, to the center of the opening of the notches 250 and 252, has a relationship b/a≤1.25 relative to the length a of the pads 210, 212, 214, and 216.

In the range of at least b/a≤1.25, the effect of relieving the reaction force hardly depends on a size (or width) of the opening of the notches 250 and 252. Therefore, even if a "cutout" formed by cutting the substrate of the FPC 106 with a predetermined length is used instead of the notches 250 and 252 having a finite width, the effect of relieving the reaction force as described above may be obtained. Although the notches 205 and 252 are symmetrically provided in the embodiment, the notches 205 and 252 may be provided at asymmetric positions, and more preferably, the asymmetric positions may be determined to satisfy a relationship b/a≤1.25.

Hereinafter, a modified example of the present embodiment will be described with reference to FIGS. 5 to 14. The FPCs as shown below represent FPCs that may be used for the optical modulator 100 instead of the FPC 106, respectively.

First Modified Example

First, a first modified example of the FPC 106 used for the optical modulator 100 shown in FIG. 1A will be described.

In the FPC 106 shown in FIG. 2, on two sides 204 and 206 adjacent to one side 200 on which the pads 210, 212, 214, and 216 are foamed, there are symmetrically provided the rectangular notches 250 and 252 in the vicinity of two corner portions 240 and 242 connected to the one side 200.

On the other hand, in this modified example, in addition to the notches 250 and 252, on the two sides 204 and 206, there are symmetrically provided rectangular notches also in the vicinity of two corner portions connected to an other side 202 opposite to the one side 200.

FIG. 5 is a diagram showing a configuration of an FPC 500 that may be used instead of the FPC 106 according to this modified example. In FIG. 5, the same reference numerals as those in FIG. 2 are used for the same components as those of the FPC 106 shown in FIG. 2, and the description of FIG. 2 as described above is cited.

The FPC 500 shown in FIG. 5 has the same configuration as the FPC 106 shown in FIG. 2, except that there are symmetrically provided rectangular notches 510 and 512, respectively, also in the vicinity of two corner portions 502 and 504 (that is, corner portions at respective ends of the side 202) connected to an other side 202 opposite to one side 200 on which the pads 210, 212, 214, and 216 are formed.

In the FPC 106 shown in FIG. 2, the corner portions at respective ends of the side 202 are likely to be deformed due to the manufacturing process of the FPC 106, and the corner portions are likely to be brought into contact with a portion of the housing 104 when the lead pins 120, 122, 124, and 126 are fixed to the through-holes 220, 222, 224, and 226 of the FPC 106 with solders. As a result of this contact, stress is applied to the corner portions at respective ends of the side 202 of the FPC 106, the stress propagates in the plane of the FPC 106 and is transmitted to the side of the side 200 opposite to the side 202, and deformation in the formed portions of the pads 210, 212, 214, and 216 may be induced.

In this modified example, since the notches 510 and 512 are formed also in the vicinity of the corner portions 502 and 504 at respective ends of the side 202 abutting on the housing 104, stress applied by abutting is released by the notches 510 and 512. Thus, it is possible to effectively prevent the generation of deformation in the pads 210, 212, 214, and 216.

As in the notches 250 and 252 of the FPC 106 shown in FIG. 2, instead of the notches 510 and 512 having a finite width, the portions of the notches 510 and 512 may be configured as a cutout obtained by cutting the FPC 500 by a predetermined length.

Second Modified Example

Next, a second modified example of the FPC 106 used for the optical modulator 100 shown in FIG. 1A will be described.

In this modified example, instead of the notches 250 and 252, rectangular notches are symmetrically disposed in the vicinity of the corner portions 240 and 242 on one side 200, respectively.

Figure 6:
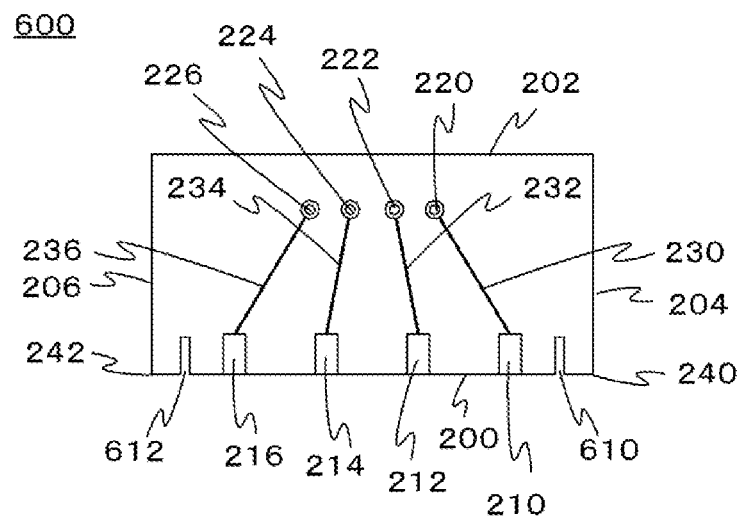
FIG. 6 is a diagram showing a second modified example of the FPC used for the optical modulator shown in FIG. 1A.

FIG. 6 is a diagram showing a configuration of an FPC 600 that may be used instead of the FPC 106 according to this modified example. In FIG. 6, the same reference numerals as those in FIG. 2 are used for the same components as those of the FPC 106 shown in FIG. 2, and the description of FIG. 2 as described above is cited.

The FPC 600 shown in FIG. 6 has the same configuration as the FPC 106 shown in FIG. 2, except that, on one side 200 on which the pads 210, 212, 214, and 216 are formed, there are provided rectangular notches 610 and 612, respectively, in a direction substantially parallel to the length direction of the pads 210, 212, 214, and 216, and in the vicinity of two corner portions 240 and 242 (that is, corner portions at respective ends of the side 200) connected to the one side 200.

In this modified example, since the notches 610 and 612 are provided on one side 200 on which the pads 210, 212, 214, and 216 are formed, the formed region of the wiring patterns 230, 232, 234, and 236 that connect the pads 210, 212, 214, and 216 to the through-holes 220, 222, 224, and 226 may be secured widely.

As in the notches 250 and 252 of the FPC 106 shown in FIG. 2, instead of the notches 610 and 612 having a finite width, the portions of the notches 610 and 612 may be configured as a cutout obtained by cutting the FPC 600 by a predetermined length.

Third Modified Example

Next, a third modified example of the FPC 106 used for the optical modulator 100 shown in FIG. 1A will be described.

In this modified example, on the two sides 204 and 206, there are disposed curved notches at positions which are not in the vicinity of the corner portions 240 and 242. In this modified example, when notches 250 and 252 may not be provided in the vicinity of the corner portions 240 and 242, for example, due to the method of holding the FPC board of the assembling jig, and the like, the vicinity of the corner portions 240 and 242 may be used as an alternative configuration of the FPC 106.

Figure 7:
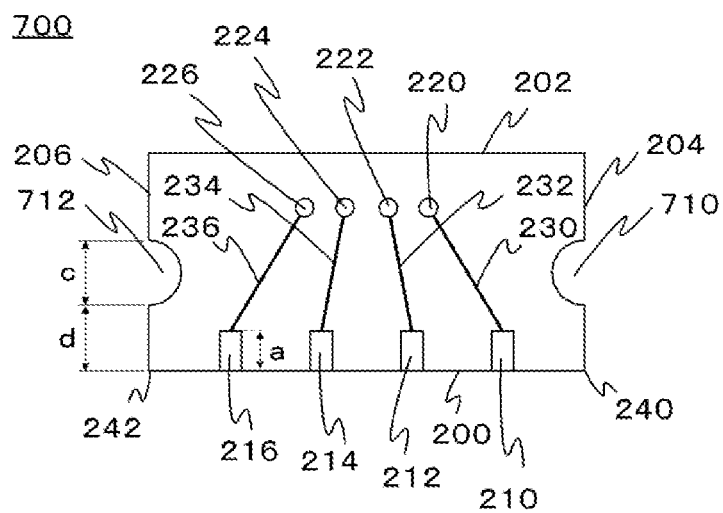
FIG. 7 is a diagram showing a third modified example of the FPC used for the optical modulator shown in FIG. 1A.

FIG. 7 is a diagram showing a configuration of an FPC 700 that may be used instead of the FPC 106 according to this modified example. In FIG. 7, the same reference numerals as those in FIG. 2 are used for the same components as those of the FPC 106 shown in FIG. 2, and the description of FIG. 2 as described above is cited.

The FPC 700 shown in FIG. 7 has the same configuration as the FPC 106 shown in FIG. 2, except that instead of the notches 250 and 252 having a rectangular shape provided in the vicinity of the corner portions 240 and 242, notches 710 and 712 having a notched shape along a predetermined curve are disposed in portions away from the corner portions 240 and 242 (portions which are not in the vicinity), and the shape of the FPC 700 in a plan view has a constricted shape.

In this modified example, particularly, since notches 710 and 712 are provided at positions which are not in the vicinity of the corner portions 240 and 242 close to the pads 210, 212, 214, and 216, and are away from the corner portions 240 and 242 and, the openings of the notches 710 and 712 are widely formed. As a result, since stress generated in the corner portions 240 and 242 is released in a wide range of the sides 204 and 206, deformation of the FPC 700 is suppressed. Since the notches 710 and 712 are curved and do not have bent portions, stress does not concentrate at a portion of the edges of the notches 710 and 712, and the stress may be dispersed on average.

The shape of the notches 710 and 712 may be various shapes such as a semicircular shape, a semi-elliptical shape, a combination of an arc and a straight line, and the like.

Figures 8A, 8B, 9:
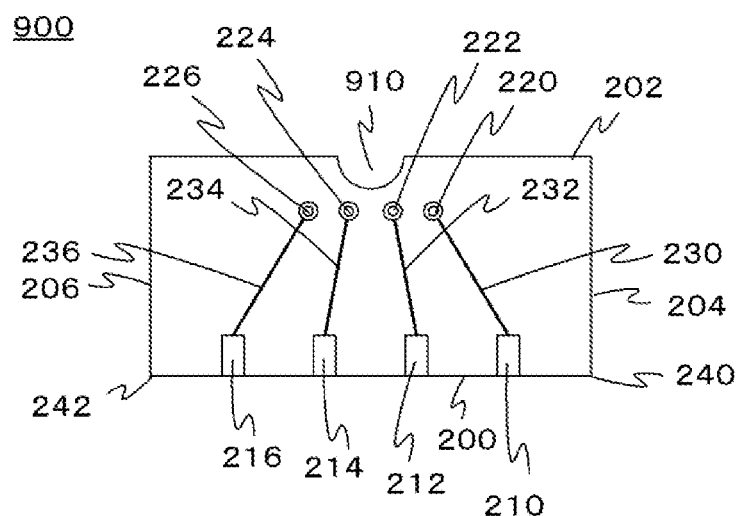
FIG. 8A is a diagram showing an evaluation result on a relationship between a size of an opening of a notch and solder connection quality in the third modified example shown in FIG. 7.
FIG. 8B is a diagram showing an evaluation result on a relationship between a size of an opening of a notch and solder connection quality in a third modified example shown in FIG. 7.
FIG. 9 is a diagram showing a fourth modified example of the FPC used for the optical modulator shown in FIG. 1A.

The effect of relieving stress depends on a breadth and position of the opening of notches 710 and 712. FIGS. 8A and 8B show results obtained by evaluating the uniformity and finished quality of solder connection portions between the pads 210, 212, 214, and 216 of the FPC 700 and the pads 310, 312, 314, and 316 of the circuit board 300, by changing the size of the opening of the notches 710 and 712, when the notches 710 and 712 are disposed at two different positions.

In this evaluation, a parameter c/a obtained by normalizing a width c of the opening of the notches 710 and 712 shown in FIG. 7 with a length a (vertical distance in the figure) of the pads 210, 212, 214, and 216 was used, and the uniformity and finished quality of the solder connection portions were evaluated in various values of c/a. The evaluation criteria are the same as the evaluation criteria of the evaluation in FIG. 4 as described above.

FIG. 8A shows an evaluation result when a distance d from an endpoint (the start position of the notches 710 and 712) closer to the side 200, out of the endpoints of the notches 710 and 712, to the side 200 has a relationship d=1.25a relative to the length a (a vertical distance in FIG. 7) of the pads 210, 212, 214, and 216, and FIG. 8B shows an evaluation result when d=2a. In FIGS. 8A and 8B, the length a of all the pads 210, 212, 214, and 216 is about 1.3 mm.

The reason why the evaluation is performed at d=1.25a and 2a is that this modified example is an alternative configuration in the case where the notches 250 and 252 may not be provided in the vicinity of the corner portions 240 and 242. Therefore, since it is preferable that the applicable range of this modified example is in the range of d≥a, it is considered that d=1.25a and 2a are preferable as representative points within a practical range of d≥a.

From FIGS. 8A and 8B, it is understood that satisfactory results are obtained in the range of c/a≥1 both in the case of d=1.25a and in the case of d=2a. Therefore, it is preferable that the range of the position and shape of the notches 710 and 712 is in the range of d≥a and c≥a.

Fourth Modified Example

Next, a fourth modified example of the FPC 106 used for the optical modulator 100 shown in FIG. 1A will be described.

The notches 250 and 252 of the FPC 106 shown in FIG. 2, for example, are intended to relieve a reaction force to be generated when the pads 210, 212, 214 and 216 are pressed against the circuit board, due to deformation generated in the FPC 106 in the manufacturing process of FPC 106.

On the other hand, an object of this modified example is to effectively suppress deformation of the FPC generated in the assembly process of the optical modulator 100, such as a process of inserting the lead pins 120, 122, 124, and 126 through the through-holes 220, 222, 224, and 226 and fixing the lead pins 120, 122, 124, and 126 and the through-holes 220, 222, 224 with solders, and the like.

FIG. 9 is a diagram showing a configuration of an FPC 900 that may be used instead of the FPC 106 according to this modified example. In FIG. 9, the same reference numerals as those in FIG. 2 are used for the same components as those of the FPC 106 shown in FIG. 2, and the description of FIG. 2 as described above is cited.

The FPC 900 shown in FIG. 9 has the same configuration as the FPC 106 shown in FIG. 2, except that the FPC 900 does not include the notches 250 and 252 having a rectangular shape, and includes a curved notch 910 in a substantially central portion of a side 202 on the side, where the through-holes 220, 222, 224, and 226 are formed, opposite to the one side 200 on which the pads 210, 212, 214 and 216 are formed.

The deformation of the FPC generated in the assembly process of the optical modulator 100 is mainly caused by the following.

Stress generated according to a difference in thermal expansion coefficient between the lead pins 120, 122, 124, and 126 and the FPC, due to heat generated when the lead pins 120, 122, 124, and 126, and the through-holes 220, 222, 224, and 226 are fixed with solders;

Stress generated due to friction and the like between the lead pins 120, 122, 124, and 126 and the through-holes 220, 222, 224, and 226, when the lead pins 120, 122, 124, and 126 are inserted into the through-holes 220, 222, 224, and 226;

Stress generated and caused by that the side 202 of the through-hole 220, 222, 224, and 226 abuts on the housing 104 of the optical modulator 100, when the lead pins 120, 122, 124, and 126 are connected and fixed to the through-holes 220, 222, 224, and 226, and the like.

Such stress leads to deformation in the vicinity of the side 202 on the side of the through-holes 220, 222, 224, and 226, opposite to the side 200 on which the pads 210, 212, 214, and 216 are formed, or in the vicinity of the formed positions of the through-holes 220, 222, 224, and 226.

Since the FPC 900 of this modified example has the notch 910 of the side 202 on the side where the through-holes 220, 222, 224, and 226 are formed, it is possible to release stress that may be generated in the assembly process of the optical modulator 100 as described above, and to effectively prevent deformation of the FPC 900 caused by the stress. As a result, it is possible to prevent the deformation (or distortion) from propagating to the side 200, and to obtain satisfactory connection uniformity and finished quality in soldering connection between the pads 210, 212, 214, and 216 and the pads 310, 312, 314, and 316 of the circuit board 300, and it is possible to reduce effectively and inexpensively variation in high-frequency characteristics of the signal path from the circuit board 300 to the optical modulator 100.

In FIG. 9, the notch 910 is shown to be semicircular, but the shape of the notch 910 is not limited to this, and the shape may be various curved shapes such as a semi-elliptical shape, a combination of an arc and a straight line, and the like.

Fifth Modified Example

Next, a fifth modified example of the FPC 106 used for the optical modulator 100 shown in FIG. 1A will be described.

An object of this modified example is to reduce or prevent deformation of the FPC during positioning such that stress applied to the FPC is reduced when the FPC is brought into contact with a predetermined portion of the housing 104 of the optical modulator 100 to position the FPC relative to the housing 104.

Figures 10, 11:
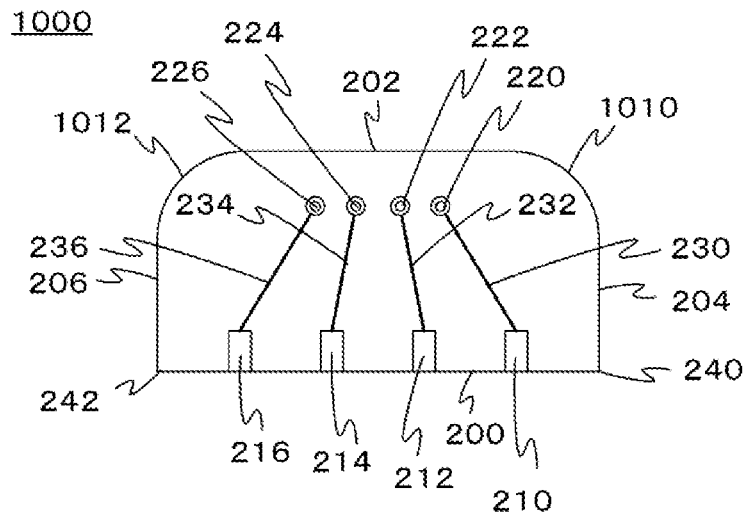
FIG. 10 is a diagram showing a fifth modified example of the FPC used for the optical modulator shown in FIG. 1A.
FIG. 11 is a diagram showing an evaluation result on a relationship between a radius of curvature of a curved portion and solder connection quality in a third modified example shown in FIG. 10.

FIG. 10 is a diagram showing a configuration of an FPC 1000 that may be used instead of the FPC 106 according to this modified example. In FIG. 10, the same reference numerals as those in FIG. 2 are used for the same components as those of the FPC 106 shown in FIG. 2, and the description of FIG. 2 as described above is cited.

The FPC 1000 shown in FIG. 10 has the same configuration as the FPC 106 shown in FIG. 2, except that the FPC 1000 does not include the notches 250 and 252, and is configured such that curved portions 1010 and 1012 having a predetermined radius of curvature are connected between a side 202 on the side where the holes 220, 222, 224, and 226 are formed, opposite to one side 200 on which the pads 210, 212, 214, and 216 are formed, and two sides 204 and 206 adjacent to the side 202.

In a case where one side of the FPC is brought into contact with a predetermined portion of the housing 104 of the optical modulator 100 to position the FPC, with deformation (for example, due to the manufacturing process of the FPC) corresponding to the one side or the corner portions at respective ends of the one side, the deformation is promoted by the contact with the housing 104 (that is, the deformation is enlarged). Therefore, stress and strain generated in the FPC due to the deformation propagate to an other side, so that adhesion between the pads formed on the FPC and the pads of the external circuit board decreases and the uniformity of solder connection between these pads may deteriorate.

In this modified example, the curved portions 1010 and 1012 having a predetermined radius of curvature are connected between the side 202 abutting on the housing 104 (that is, the side 202 on the side on which the through-holes 220, 222, 224, and 226 are formed, opposite to one side 200 where the pads 210, 212, 214, and 216 are formed), and two sides 204 and 206 adjacent to the side 202, and the corner portions are not provided at respective ends of the side 202. Therefore, in this modified example, it is possible to effectively suppress or prevent the stress or strain due to the deformation of the side 202 generated or promoted by abutting on the housing 104 from propagating to the side 200, so that satisfactory adhesion between the pads 210, 212, 214, and 216 and the pads 310, 312, 314, and 316 of the circuit board 300 may be maintained, and the uniformity of solder connection may be secured. As a result, it is possible to obtain satisfactory connection uniformity and finished quality in soldering connection between the pads 210, 212, 214, and 216 and the pads 310, 312, 314, and 316 of the circuit board 300, and it is possible to effectively and inexpensively reduce variation in the high-frequency characteristics of the signal path from the circuit board 300 to the optical modulator 100.

The effect of suppressing the propagation of stress or strain generated and caused by abutting on the housing 104 as described above depends on radii of curvature of the curved portions 1010 and 1012 which are connected between the side 202 abutting on the housing 104, and the sides 204 and 206 adjacent to the side 202.

FIG. 11 shows results obtained by evaluating the uniformity and finished quality of the solder connection portions between the pads 210, 212, 214, and 216 of the FPC 1000 and the pads 310, 312, 314, and 316 of the circuit board 300 by changing the radius of curvature of the curved portions 1010 and 1012.

In this evaluation, a parameter R/L obtained by normalizing the radius of curvature R of the curved portions 1010 and 1012 shown in FIG. 10 with a distance L from the side 202 abutting on the housing 104 to the side 200 on which the pads 210, 212, 214, and 216 are formed was used, and the uniformity and finished quality of the solder connection portions were evaluated in various values of R/L. The evaluation criteria are the same as the evaluation criteria of the evaluation in FIG. 4 as described above.

According to the evaluation result shown in FIG. 11, it is understood that it is preferable to set the radius of curvature R of the curved portions 1010 and 1012 to be R≥L/7 in order to obtain satisfactory uniformity and finished quality of the solder connection portions. For example, when L is 10 mm (as described above, the general length of the short side of the FPC for optical modulator is about 10 mm or less), it is preferable that the radius of curvature R of the curved portions 1010 and 1012 is about 1.4 mm.

As described above, since the curved portions 1010 and 1012 are formed having a radius of curvature (in the aforementioned example, about 1.4 mm or more relative to L=10 mm) according to the size L of the FPC 1000 so as to suppress or prevent the propagation of strain caused by that the deformation at the time of manufacture of the FPC 1000 having flexibility is promoted by abutting on the housing 104, the curved portions 1010 and 1012 are completely different in a size or purpose from chamfering which is performed in general in order to remove burr and the like formed at the corner portions regardless of the size of the main body portion (in general, about 0.5 mm at the most).

In FIG. 10, the curved portions 1010 and 1012 are shown by an arc, but the shapes of the curved portions 1010 and 1012 are not limited to this and may be configured by an optional curved line other than an ellipse as long as it has a predetermined radius of curvature.

Sixth Modified Example

Next, a sixth modified example of the FPC 106 used for the optical modulator 100 shown in FIG. 1A will be described.

Figure 12:
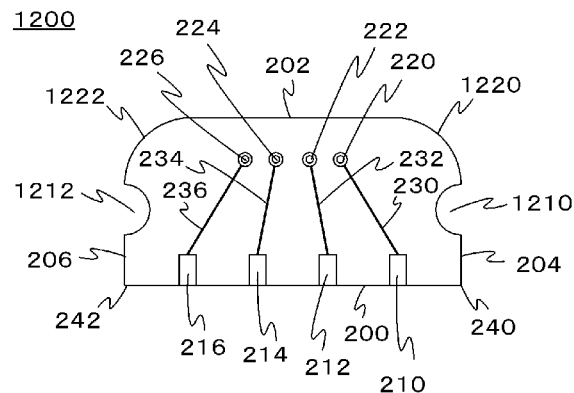
FIG. 12 is a diagram showing a sixth modified example of the FPC used for the optical modulator shown in FIG. 1A.

FIG. 12 is a diagram showing a configuration of an FPC 1200 that may be used instead of the FPC 106 according to this modified example. In FIG. 12, the same reference numerals as those in FIG. 2 are used for the same components as those of the FPC 106 shown in FIG. 2, and the description of FIG. 2 as described above is cited.

The FPC 1200 shown in FIG. 12 has the same configuration as the FPC 106 shown in FIG. 2, except that instead of the notches 250 and 252 provided in the vicinity of the corner portions 240 and 242, notches 1210 and 1212 having a notched shape along a predetermined curve are disposed in portions away from the corner portions 240 and 242 (portions which are not in the vicinity), and the shape of the FPC 1200 in a plan view has a constricted shape. The curved portions 1220 and 1222 having a predetermined radius of curvature are connected between the side 202 on the side where the through-holes 220, 222, 224, and 226 are formed, opposite to one side 200 on which the pads 210, 212, 214, and 216 are formed, and the two side 204 and 206 adjacent to the side 202.

This modified example is a combination of the notches 710 and 712 (FIG. 7) of the FPC 700 according to the third modified example and the curved portions 1010 and 1012 (FIG. 10) of the FPC 1000 according to the fifth modified example. As a result, in this modified example, notches 1210 and 1212 are formed in portions which are not in the vicinity of the pads 210, 212, 214 and 216, and the curved portions 1220 and 1222 prevent deformation of the FPC 1200 from being promoted, and propagation of strain caused by abutting on the housing 104.

Seventh Modified Example

Next, a seventh modified example of the FPC 106 used for the optical modulator 100 shown in FIG. 1A will be described.

Figure 13:
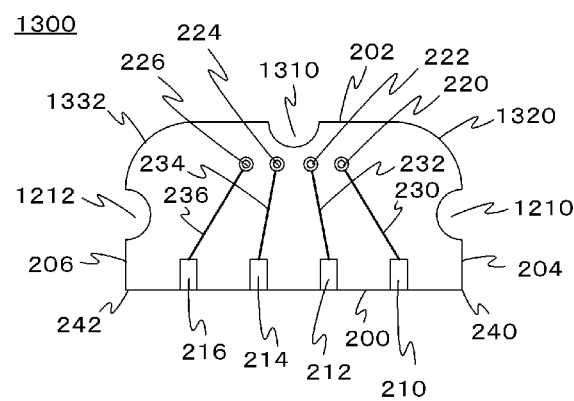
FIG. 13 is a diagram showing a seventh modified example of the FPC used for the optical modulator shown in FIG. 1A.

FIG. 13 is a diagram showing a configuration of an FPC 1300 that may be used instead of the FPC 106 according to this modified example. In FIG. 13, the same reference numerals as those in FIG. 2 are used for the same components as those of the FPC 106 shown in FIG. 2, and the description of FIG. 2 as described above is cited.

The FPC 1300 shown in FIG. 13 has the same configuration as the FPC 106 shown in FIG. 2, except that instead of the notches 250 and 252 provided in the vicinity of the corner portions 240 and 242, notches 1310 and 1312 having a notched shape along a predetermined curve are disposed in portions away from the corner portions 240 and 242 (portions which are not in the vicinity), and the shape of the FPC 1300 in a plan view has a constricted shape. The FPC 1300 further includes a curved notch 1320 in a substantially central portion of the side 202 on the side where the through-holes 220, 222, 224, and 226 are formed, opposite to the one side 200 on which the pads 210, 212, 214, and 216 are formed. Further, the curved portions 1330 and 1332 having a predetermined radius of curvature are connected between the side 202, and the two sides 204 and 206 adjacent to the side 202.

This modified example is a combination of the notches 710 and 712 (FIG. 7) of the FPC 700 according to the third modified example, the notch 910 (FIG. 9) of the FPC 900 according to the fourth modified example, and the curved portions 1010 and 1012 (FIG. 10) of the FPC 1000 according to the fifth modified example, and the notches 1310 and 1312 are formed in portions which are not in the vicinity of the pads 210, 212, 214, and 216. A notch 1320 is formed in the side 202 on the side where the through-holes 220, 222, 224, and 226 are formed, and deformation of the FPC 1300 which may be generated in a process of connecting the through-holes 220, 222, 224, and 226 and the lead pins 120, 122, 124, and 126 is suppressed or reduced. Further, the curved portions 1330 and 1332 prevent deformation of the FPC 1300 from being promoted, and propagation of strain caused by that the side 202 abuts on the housing 104.

Figure 14:
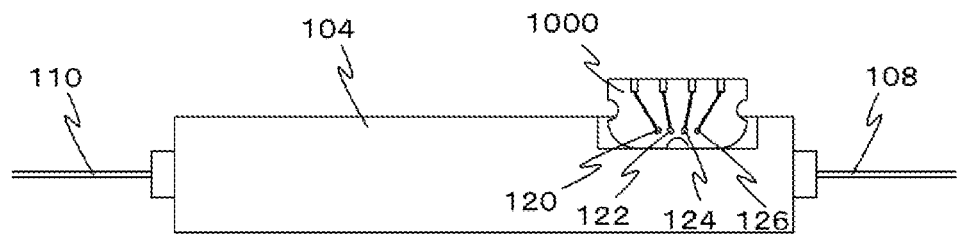
FIG. 14 is a diagram showing an example of a state in which the FPC shown in FIG. 13 is positioned and fixed abutting on the housing of the optical modulator.

Particularly, the modified examples shown in FIGS. 9, 10, 12, and 13 are intended to reduce or suppress deformation, stress, and/or strain generated in the FPCs 9000, 1000, 1200, and 1300 when the side 202 on the side where the through-holes 220, 222, 224, and 226 are formed, opposite to one side 200 on which the pads 210, 212, 214, and 216 are formed, is brought into contact with a portion of the housing 104 of the optical modulator 100. FIG. 14 shows an example of a state in which the side 202 of the FPC 1300 shown in FIG. 13 is positioned abutting on the housing 104, and the through-holes 220, 222, 224, and 226 and the lead pins 120, 122, 124, and 126 are fixed with solders. FIGS. 9, 10, and 12 also have the same configuration as the FPC 1300 shown in FIG. 14, and the through-holes 220, 222, 224, and 226 and the lead pins 120, 122, 124, and 126 may be fixed with solders in a state where the side 202 is positioned abutting on the housing 104.

As described above, since the curved portions 1010 and 1012, 1210 and 1212, and 1330 and 1332 in the modified examples shown in FIGS. 10, 12, and 13 are intended to reduce or relieve (suppress) stress or strain generated when the side 202 abuts on the housing 104, it should be noted that it is not meaningful to process the housing 104 so as to have the same curves as those of the curved portions and to bring the curved portion 1010 or the like into contact with the housing 104 having the curves.

Second Embodiment

Next, a second embodiment of the present invention will be described. This embodiment is an optical transmission apparatus on which the optical modulator 100 (including any modified examples shown in FIGS. 5 to 13) shown in the first embodiment is mounted.

Figure 15:
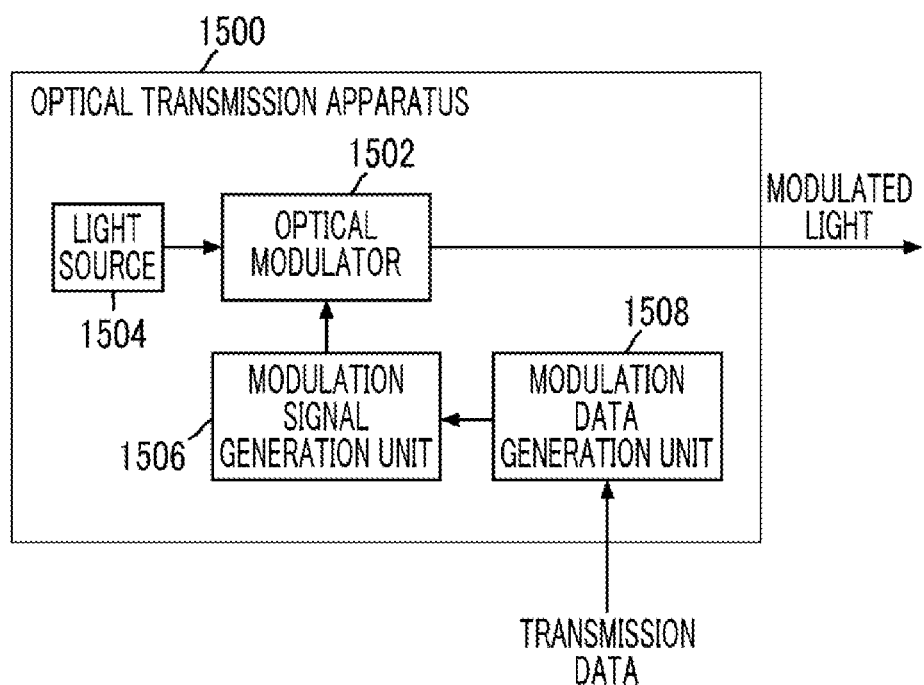
FIG. 15 is a diagram showing a configuration of an optical transmission apparatus according to a second embodiment of the present invention.
Figure 16A:
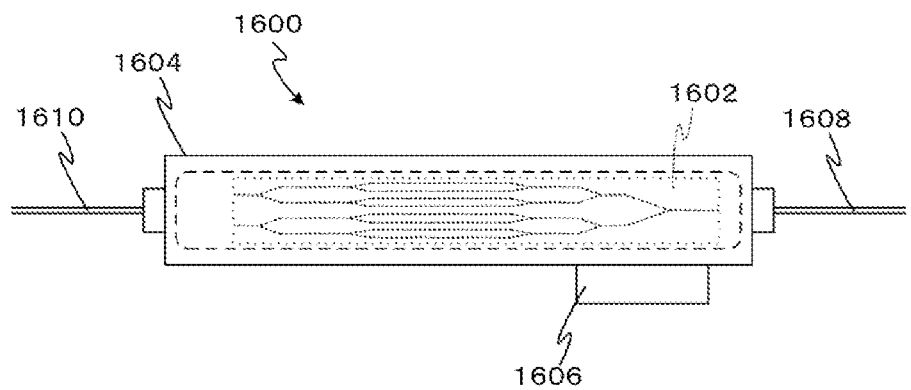
FIG. 16A is a top view of an optical modulator in the related art.
Figure 16B:
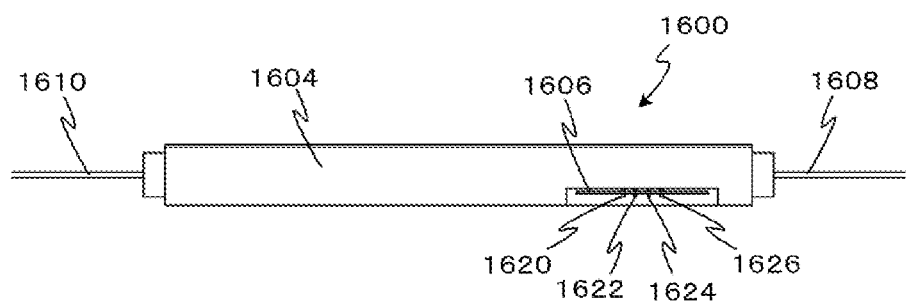
FIG. 16B is a side view of the optical modulator in the related art.
Figure 16C:
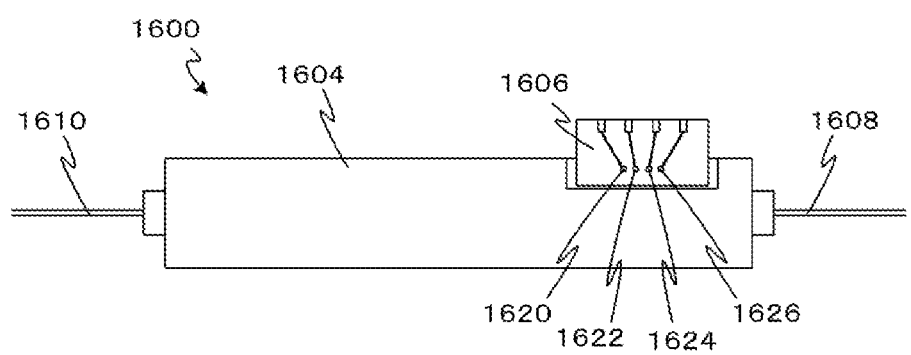
FIG. 16C is a bottom view of the optical modulator in the related art.
Figure 17:
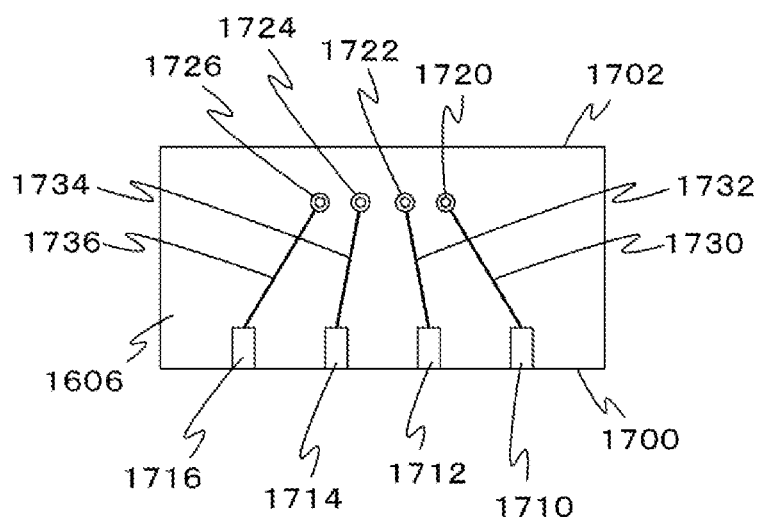
FIG. 17 is a diagram showing a configuration of an FPC used for the optical modulator shown in FIG. 16.
Figure 18A:
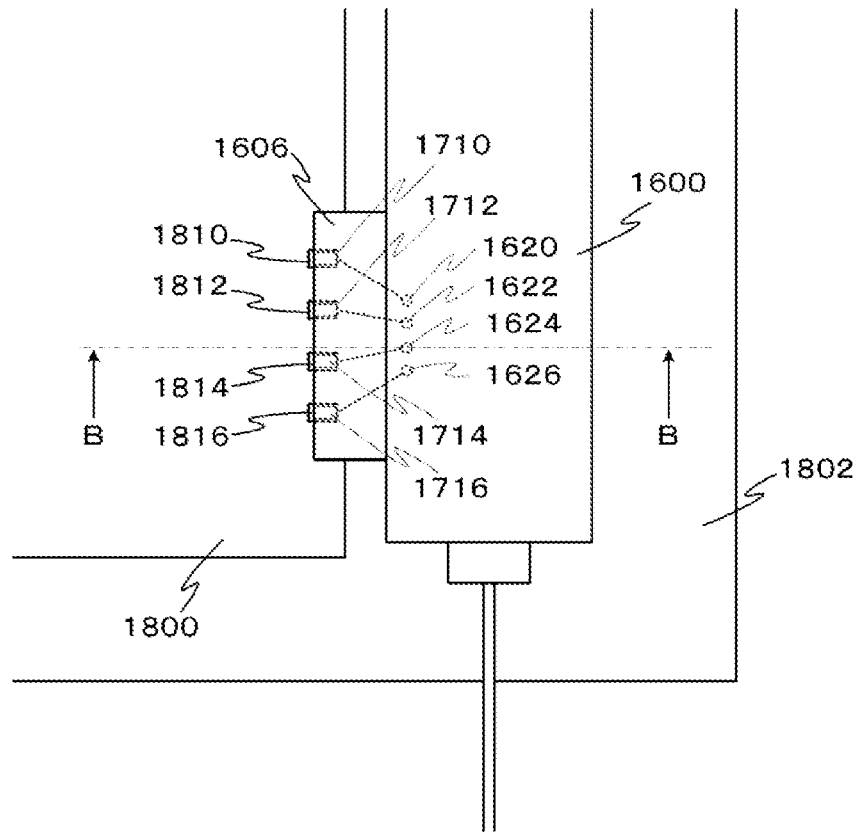
FIG. 18A is a diagram showing an example of a state in which the optical modulator shown in FIG. 16A is connected to a circuit board on which an electronic circuit is formed.
Figure 18B:
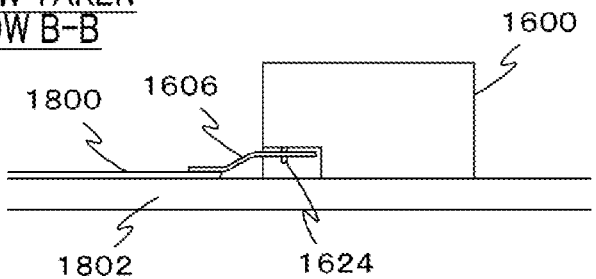
FIG. 18B is a diagram showing an example of a state in which the optical modulator shown in FIG. 16A is connected to a circuit board on which an electronic circuit is formed.
Figure 19:
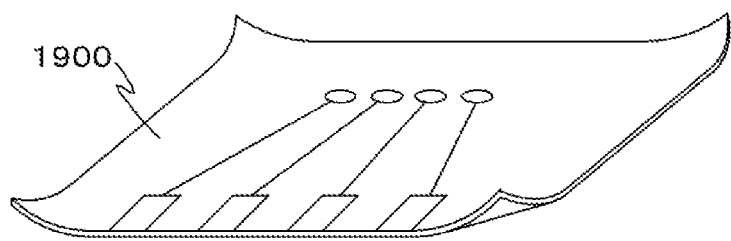
FIG. 19 is a diagram showing an example of deformation of an FPC.

FIG. 15 is a diagram showing the configuration of the optical transmission apparatus according to the present embodiment. The optical transmission apparatus 1500 includes an optical modulator 1502, alight source 1504 that enters light to the optical modulator 1502, a modulation signal generation unit 1506, and a modulation data generation unit 1508.

The optical modulator 1502 includes an optical modulator 100 shown in FIG. 1A (having one of the FPCs 500, 600, 700, 1000, 1200, and 1300 shown in FIGS. 5 to 7, 9, 10, 12, and 13, instead of the FPC 106). The modulation data generation unit 1508 receives transmission data that have been transmitted from the outside, generates modulation data (for example, data obtained by converting or processing the transmission data into a predetermined data format) for transmitting the transmission data, and outputs the generated modulation data to the modulation signal generation unit 1506.

The modulation signal generation unit 1506 is an electronic circuit that generates electrical signals for causing the optical modulator 1502 to perform a modulation operation, and based on modulation data output from the modulation data generation unit 1508, generates modulation signals which are high-frequency signals for causing the optical modulator 1502 to perform an optical modulation operation according to the modulation data, and inputs the modulation signals to the optical modulator 100. The modulation signals are four RF signals corresponding to the four RF electrodes (not shown) of the optical modulation element 102 included in the optical modulator 100.

The four RF signals are respectively input to the pads 210, 212, 214, and 216 of the FPC 106 (which may be one of the aforementioned modified examples of the FPC 106 as described above) of the optical modulator 100, and are respectively applied to RF electrodes via the wiring patterns 230, 232, 234, and 236, the through-holes 220, 222, 224, and 226, and the lead pins 120, 122, 124, and 126.

As a result, the light output from the light source 1504 is modulated by the optical modulator 100, becomes modulated light, and is output from the optical transmission apparatus 1500.

Particularly, since the optical transmission apparatus 1500 uses the optical modulator 100 having the aforementioned configuration, for example, connection uniformity/finished quality of solder connection between respective signal lines of the four RF signals output from the modulation signal generation unit 1506 and the pads 210, 212, 214, and 216 of the FPC 106 included in the optical modulator 100 may be made satisfactory. As a result, it is possible to effectively and inexpensively reduce variation in the high-frequency characteristics (reflection characteristics and the like) of the signal path between the signal line and the RF electrode of the optical modulation element 102 included in the optical modulator 100, and to stably mass-product the optical transmission apparatus having satisfactory characteristics.

In each of the embodiments as described above, the optical modulator including the optical modulation element that has four RF electrodes using the LN as the substrate is shown, but the present invention is not limited to this, and is also applicable to an optical modulator having the number of RF electrodes other than four, or to an optical modulator using a material other than the LN as a substrate the number of the RF electrodes in the same way. The configuration of the FPC 106 shown in FIG. 2 and the configurations of the modified examples of the FPCs 106 shown in FIGS. 5 to 13 may not only be individually used as individual FPCs alone, but also a combination of these configurations may be used for configuring one FPC.

The invention claimed is:

1. A microwave band optical modulator which performs an optical modulation by a microwave band electrical signal, comprising:
a flexible wiring board that makes an electrical connection with a circuit board,
wherein the flexible wiring board has a substantially quadrilateral shape,
pads to be electrically connected to the circuit board are formed on the flexible wiring board along one side of the substantially quadrilateral shape, and
in order to release mechanical stress applied to a side or an end portion of the flexible wiring board and/or prevent propagation of a strain generated in the side or the end portion, the flexible wiring board has a cutout or notch disposed on a side adjacent to the one side, and the cutout or notch is provided from a portion of at least one side of the substantially quadrilateral shape toward an inside of the flexible wiring board, and
the pads are foamed from the one side to a position of a distance a, and
the cutout or notch is formed at a position within a distance 1.25×a from the one side.

2. The optical modulator according to claim 1, wherein the cutout or the notch is provided in a direction substantially parallel to the one side.

3. The optical modulator according to claim 1, wherein the cutout or notch is formed in a direction substantially perpendicular to the one side.

4. The optical modulator according to claim 1, wherein an additional notch is provided on the side adjacent to the one side, the additional notch is formed in a shape obtained by cutting the flexible wiring board along a predetermined curve.

5. The optical modulator according to claim 4, wherein the pads are formed from the one side to a position of a distance a, and
the additional notch is provided such that a length c of an opening of the additional notches in the sides where the notches are provided, and a distance d from the one side to a near end of the opening have a relationship of a≤d and a≤c relative to the distance a.

6. The optical modulator according to claim 1, wherein portions formed by curves are respectively provided in connection portions between a side opposite to the one side on which the pads are formed, and two sides adjacent to the opposite side, out of the sides configuring the substantially quadrilateral shape.

7. The optical modulator according to claim 6, wherein the curves have a radius of curvature R that satisfies a relationship of R≥L/7 relative to a distance L between the one side on which the pads are formed, and the opposite side.

8. The optical modulator according to claim 1, wherein at least one additional notch is further provided on a side opposite to the one side on which the pads are formed, out of the sides configuring the substantially quadrilateral shape, and
the additional notch is formed in a shape obtained by cutting the flexible wiring board along a predetermined curve.

9. An optical transmission apparatus comprising:
the optical modulator according to claim 1, and
an electronic circuit for generating an electrical signal for causing the optical modulator to perform a modulation operation.

10. The optical modulator according to claim 2, wherein the cutout or notch is formed in a direction substantially perpendicular to the one side.

11. An optical transmission apparatus comprising:
the optical modulator according to claim 2, and
an electronic circuit for generating an electrical signal for causing the optical modulator to perform a modulation operation.

12. A microwave band optical modulator which performs an optical modulation by a microwave band electrical signal, comprising:
a flexible wiring board that makes an electrical connection with a circuit board,
wherein the flexible wiring board has a substantially quadrilateral shape,
pads to be electrically connected to the circuit board are formed on the flexible wiring board along one side of the substantially quadrilateral shape,
the flexible wiring board has a cutout or notch, configured to release mechanical stress applied to a side or an end portion of the flexible wiring board and/or prevent propagation of a strain generated in the side or the end portion, and
the cutout or notch extends from the one side toward an inside of the flexible wiring board at an outside of both end portions along an arrangement direction in which arrangement of the pads is formed along the one side.

* * * * *